(12) United States Patent
Fukasawa

(10) Patent No.: US 10,187,979 B2
(45) Date of Patent: Jan. 22, 2019

(54) WIRING SUBSTRATE AND ELECTRONIC COMPONENT DEVICE

(71) Applicant: SHINKO ELECTRIC INDUSTRIES CO., LTD., Nagano-shi, Nagano (JP)

(72) Inventor: Ryo Fukasawa, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/852,950

(22) Filed: Dec. 22, 2017

(65) Prior Publication Data

US 2018/0184518 A1    Jun. 28, 2018

(30) Foreign Application Priority Data

Dec. 28, 2016   (JP) .................................. 2016-255368

(51) Int. Cl.
*H05K 1/02*     (2006.01)
*H05K 1/18*     (2006.01)
(Continued)

(52) U.S. Cl.
CPC ......... *H05K 1/0284* (2013.01); *H01L 23/498* (2013.01); *H05K 1/181* (2013.01); *H05K 3/205* (2013.01); *H05K 3/284* (2013.01); *H01L 24/00* (2013.01); *H05K 3/4682* (2013.01); *H05K 2201/09118* (2013.01); *H05K 2201/10674* (2013.01); *H05K 2203/0323* (2013.01); *H05K 2203/1316* (2013.01)

(58) Field of Classification Search
CPC .................. H01L 23/13; H01L 23/4952; H01L 23/49531; H05K 1/02; H05K 1/11; H05K 1/141–1/144; H05K 1/181

USPC ........................ 361/760–767, 790, 803, 813; 257/685–686

See application file for complete search history.

(56) References Cited

U.S. PATENT DOCUMENTS 5,715,147 A * 2/1998 Nagano ............. H01L 23/49531
                                                   257/672
5,917,242 A * 6/1999 Ball ..................... H01L 23/4952
                                                   257/668

(Continued)

FOREIGN PATENT DOCUMENTS

JP     2001-358285    12/2001
JP     2003-163325     6/2003

(Continued)

*Primary Examiner* — Tuan T Dinh
(74) *Attorney, Agent, or Firm* — Rankin, Hill & Clark LLP

(57) ABSTRACT

A wiring substrate includes a metal plate in which at least one wiring formation region is defined, a cavity formed in the wiring formation region, a concave part formed to have a frame shape at a peripheral edge portion of a bottom portion of the cavity, a first pad disposed at a central portion of the bottom portion of the cavity, a wiring portion connected to the first pad and disposed on and extended along the central portion of the bottom portion of the cavity, a side surface of the concave part and a bottom surface of the concave part, and a multi-layered wiring layer disposed at the central portion of the bottom portion of the cavity so as to cover the first pad and a part of the wiring portion. The multi-layered wiring layer has a second pad provided at an upper surface-side and connected to the wiring portion.

12 Claims, 15 Drawing Sheets

(51) Int. Cl.
  *H01L 23/498* (2006.01)
  *H05K 3/20* (2006.01)
  *H05K 3/28* (2006.01)
  *H01L 23/00* (2006.01)
  *H05K 3/46* (2006.01)

(56) References Cited

U.S. PATENT DOCUMENTS

| | | | | |
|---|---|---|---|---|
| 6,777,264 | B2 * | 8/2004 | Oka | H01L 23/49575 |
| | | | | 257/E23.052 |
| 7,576,433 | B2 * | 8/2009 | Ishino | G11C 5/02 |
| | | | | 257/668 |
| 7,888,785 | B2 * | 2/2011 | Ahn | H01L 23/13 |
| | | | | 257/686 |
| 8,941,246 | B2 * | 1/2015 | Miura | H01L 27/115 |
| | | | | 257/686 |
| 2016/0181190 | A1 | 6/2016 | Fukasawa et al. | |

FOREIGN PATENT DOCUMENTS

| | | |
|---|---|---|
| JP | 2007-335464 | 12/2007 |
| JP | 2016-115870 | 6/2016 |

\* cited by examiner (PARTIAL REDUCED PLAN VIEW)

(PLAN VIEW)

WIRING SUBSTRATE AND ELECTRONIC COMPONENT DEVICE

CROSS-REFERENCE TO RELATED APPLICATION

The present application claims priority from Japanese Patent Application No. 2016-255368 filed on Dec. 28, 2016, the entire content of which is incorporated herein by reference.

BACKGROUND

Technical Field

The present invention relates to a wiring substrate and an electronic component device.

Related Art

In the related art, a semiconductor device in which a plurality of semiconductor chips is accommodated in one package in association with high performance and high functionality of an electronic device has been known. In an example of the semiconductor device, semiconductor chips are flip chip-connected to both surfaces of a single wiring layer, and the semiconductor chips on both the surfaces are sealed by a mold resin. Also, a terminal part of the wiring layer is exposed from a side surface or a lower surface of the mold resin.

Patent Document 1: JP-A-2001-358285
Patent Document 2: JP-A-2003-163325
Patent Document 3: JP-A-2007-335464
Patent Document 4: JP-A-2016-115870

As described later in paragraphs of preliminary matters, there is a semiconductor device having a structure where semiconductor chips are connected with being sealed by a resin to both surfaces of a single wiring layer and a wiring portion in an outer region of the semiconductor chip is bent downward.

In this semiconductor device, since the single wiring layer is used, a degree of freedom of wiring routing is low, so that it is difficult to cope with mounting of the high-performance semiconductor chip having various pad layouts.

As the measures against the above problem, if the wiring layer is configured by a multi-layered wiring layer, the multi-layered wiring layer is also bent at the same time. For this reason, a cured interlayer resin layer of the multi-layered wiring layer may be damaged, so that it is not possible to secure the reliability of the multi-layered wiring layer.

SUMMARY

Exemplary embodiments of the present invention provides a wiring substrate having a novel structure capable of coping with mounting of an electronic component having various pad layouts and being reliably manufactured, and an electronic component device.

A wiring substrate according to an exemplary embodiment, comprises:

a metal plate in which at least one wiring formation region is defined;

a cavity formed in the wiring formation region of the metal plate;

a concave part formed to have a frame shape at a peripheral edge portion of a bottom portion of the cavity;

a first pad disposed at a central portion of the bottom portion of the cavity, the central portion being a portion of the bottom portion of the cavity where the concave part is not formed;

a wiring portion connected to the first pad and disposed on and extended along the central portion of the bottom portion of the cavity, a side surface of the concave part and a bottom surface of the concave part; and a multi-layered wiring layer disposed at the central portion of the bottom portion of the cavity so as to cover the first pad and a part of the wiring portion, the multi-layered wiring layer having a second pad provided at an upper surface-side of the multi-layered wiring layer and connected to the wiring portion.

An electronic component device according to an exemplary embodiment, comprises:

a wiring layer comprising a first pad and a wiring portion connected to the first pad;

a multi-layered wiring layer formed on the wiring layer and having a second pad provided at an upper surface-side of the multi-layered wiring layer and connected to the wiring layer;

a first electronic component having a connection terminal connected to an upper surface of the second pad of the multi-layered wiring layer;

a second electronic component having a connection terminal connected to a lower surface of the first pad of the multi-layered wiring layer;

a first resin configured to seal the multi-layered wiring layer, the first electronic component and an upper surface of the wiring portion; and a second resin configured to seal the second electronic component and a lower surface of the wiring portion, wherein the wiring portion has an exposed wiring portion extending with being exposed to an outside of the multi-layered wiring layer, as seen from a plan view, wherein the exposed wiring portion is bent downward on the way in an extending direction thereof, and wherein the wiring portion has a connection portion horizontally disposed at an outer tip end portion, and a lower surface of the connection portion is exposed from a lower surface of the second resin.

A manufacturing method of a wiring substrate according to an exemplary embodiment, the method comprises:

preparing a metal plate in which at least one wiring formation region is defined;

forming a first pad at a central portion of the wiring formation region of the metal plate and forming a wiring portion to be connected to the first pad at a peripheral edge portion of the wiring formation region;

forming a multi-layered wiring layer at the central portion of the wiring formation region of the metal plate, the multi-layered wiring layer being configured to cover the first pad and a part of the wiring portion and to have a second pad provided at an upper surface-side and connected to the wiring portion; and bending downward the peripheral edge portion of the wiring formation region of the metal plate and the wiring portion by press working.

A manufacturing method of an electronic component device according to an exemplary embodiment, the method comprises:

preparing a metal plate in which at least one wiring formation region is defined;

forming a first pad at a central portion of the wiring formation region of the metal plate and forming a wiring portion to be connected to the first pad at a peripheral edge portion of the wiring formation region;

forming a multi-layered wiring layer at the central portion of the wiring formation region of the metal plate, the multi-layered wiring layer being configured to cover the first pad and a part of the wiring portion and to have a second pad provided at an upper surface-side and connected to the wiring portion;

bending downward the peripheral edge portion of the wiring formation region of the metal plate and the wiring portion by press working and providing a connection portion horizontally disposed at an outer tip end portion of the wiring portion;

connecting a connection terminal of a first electronic component to the second pad of the multi-layered wiring layer;

forming, on the metal plate, a first resin for sealing the multi-layered wiring layer, the first electronic component and an upper surface of the wiring portion;

removing the metal plate;

connecting a connection terminal of a second electronic component to a lower surface of the first pad of the multi-layered wiring layer; and forming a second resin for sealing the second electronic component and a lower surface of the wiring portion and exposing a lower surface of a connection portion of the wiring portion from a lower surface of the second resin.

According to the below present invention, the electronic component device includes the wiring layer having the first pad and the wiring portion connected to the first pad. Also, the multi-layered wiring layer having the second pad provided at the upper surface-side and connected to the wiring layer is disposed on the wiring layer.

Also, the first electronic component is connected to the second pad provided at the upper surface-side of the multi-layered wiring layer, and the second electronic component is connected to the first pad provided at the lower surface-side.

The wiring portion has the exposed wiring portion extending to the outside of the multi-layered wiring layer with being exposed, as seen from a plan view, and the exposed wiring portion is bent downward on the way in the extending direction thereof so as to secure the accommodation part for the second electronic component of the lower side.

When manufacturing the electronic component device, the multi-layered wiring layer is disposed at the central portion of each wiring formation region of the metal plate so that the wiring portion is exposed outside the multi-layered wiring layer, and the metal plate and the wiring portion in the outer region of the multi-layered wiring layer are bent.

Thereby, since the multi-layered wiring layer is not bent, the cured insulation layer of the multi-layered wiring layer is not damaged, so that it is possible to reliably manufacture the electronic component device.

In this way, since it is possible to adopt the multi-layered wiring layer, it is possible to improve a degree of freedom of wiring routing and to cope with mounting of the high-performance electronic component having various pad layouts.

Also, since it is possible to improve the wiring density by the multilayer, it is possible to cope with a tendency that a pitch of connection terminals of the electronic component is narrowed.

DETAILED DESCRIPTION

Hereinafter, an exemplary embodiment will be described with reference to the accompanying drawings.

Before describing the exemplary embodiment, preliminary matters, which are bases of the present invention, are first described.

FIGS. 1A to 3B illustrate a semiconductor device relating to the preliminary matters. It should be noted that the preliminary matters relate to personal investigation contents of the inventors and include a novel technology, not a known technology.

Figure 1A:
FIGS. 1A to 1C are sectional views depicting a manufacturing method of a semiconductor device relating to preliminary matters (1 thereof).

In a manufacturing method of a semiconductor device relating to the preliminary matters, as shown in FIG. 1A, a metal plate 100 is first prepared. For the metal plate 100, a plurality of wiring formation regions R is defined. In FIG. 1A, one wiring formation region R is partially shown.

Figure 1B:
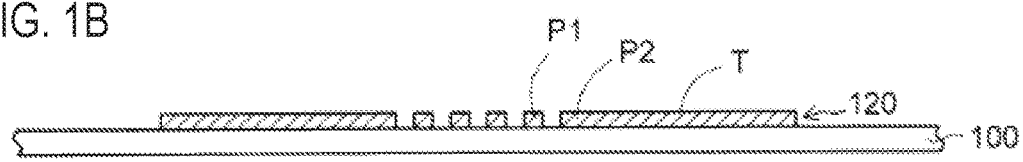

Then, as shown in FIG. 1B, a wiring layer 120 is formed on the metal plate 100. The wiring layer 120 has first pads P1 and wiring portions T disposed around there. The wiring portion T has a second pad P2 at an inner tip end portion thereof.

Figure 1C:
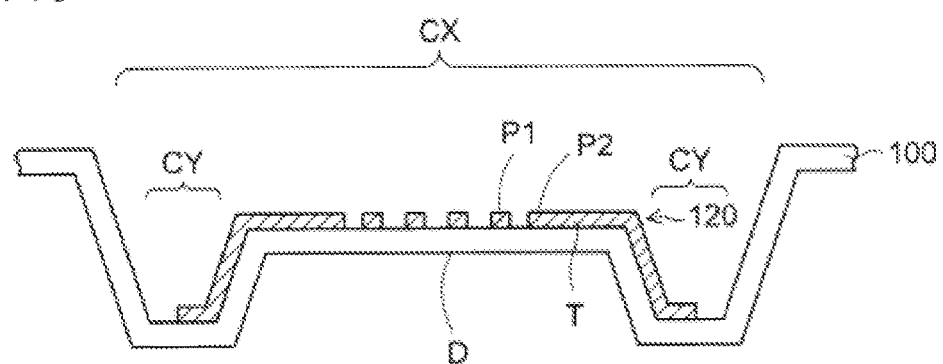

Also, as shown in FIG. 1C, the metal plate 100 having the wiring layer 120 formed thereon is bent by press working. Thereby, a collective cavity CX is formed in the wiring formation region R of the metal plate 100. Also, at the same time, frame-shaped concave parts CY are formed at peripheral edge portions of a bottom portion of the cavity CX.

Thereby, the wiring portion T of the wiring layer 120 is bent downward from a central portion thereof, so that a tip end portion of the wiring portion T is disposed on a bottom surface of the concave part CY. Also, a depressed part is formed at a lower surface-side of the wiring formation region R of the metal plate 100.

Figure 2A:
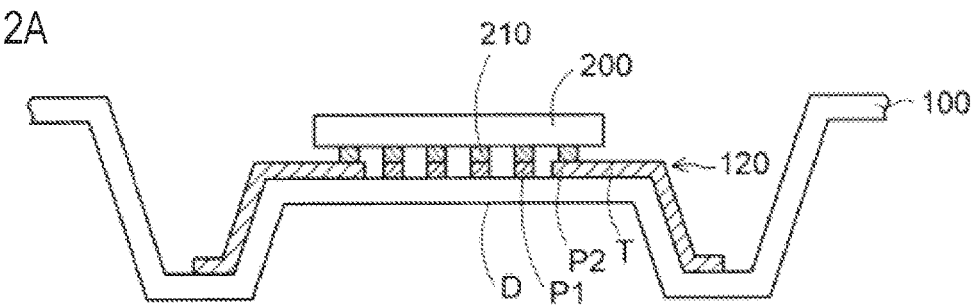
FIGS. 2A and 2B are sectional views depicting the manufacturing method of the semiconductor device relating to the preliminary matters (2 thereof).

Then, as shown in FIG. 2A, connection terminals 210 of a first semiconductor chip 200 are flip chip-connected to respective upper surfaces of the first pads P1 and the second pads P2 of the wiring layer 120.

Figure 2B:
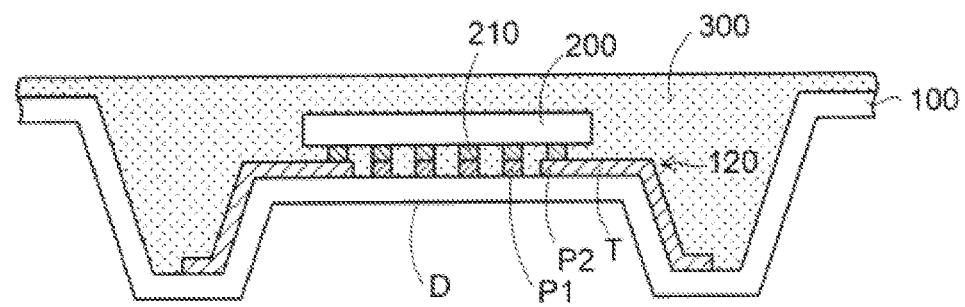

Also, as shown in FIG. 2B, a first mold resin 300 for sealing the first semiconductor chip 200 is formed on the metal plate 100.

Figure 3A:
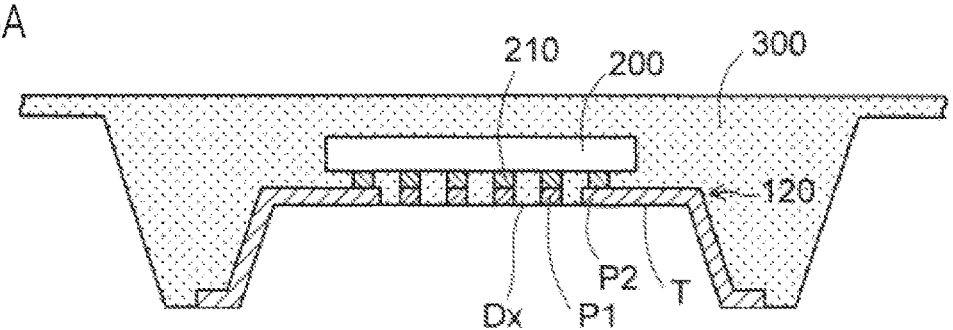
FIGS. 3A and 3B are sectional views depicting the manufacturing method of the semiconductor device relating to the preliminary matters (3 thereof).

Then, as shown in FIG. 3A, the metal plate 100 is selectively removed with respect to the wiring layer 120 and the first mold resin 300. Thereby, a lower surface of the wiring layer 120 and a lower surface of the first mold resin 300 are exposed. Also, an accommodation part Dx corresponding to the depressed part D of the metal plate 100 is provided at the lower surface-side of the wiring layer 120.

Figure 3B:
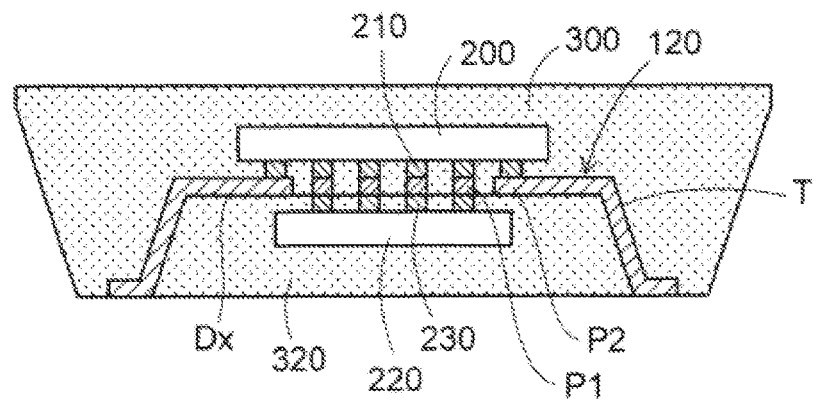

Subsequently, as shown in FIG. 3B, connection terminals 230 of the second semiconductor chip 220 are flip chip-connected to lower surfaces of the first pads P1 of the wiring layer 120. Thereby, the second semiconductor chip 220 is accommodated in the accommodation part Dx.

Also, the second semiconductor chip 220 is sealed by a second mold resin 320. At this time, the second mold resin 320 is formed so that lower surfaces of the tip end portions of the wiring portions T of the wiring layer 120 are exposed from a lower surface of the second mold resin 320.

Then, as shown in FIG. 3B, coupling portions of the first mold resin 300 are cut to obtain each semiconductor device.

As described above, in the semiconductor device of the preliminary matters, the connection terminals 210 of the first semiconductor chip 200 are connected to the upper surfaces of the first pads P1 and the second pads P2 of the wiring layer 120, which is a single layer. Also, the connection terminals 230 of the second semiconductor chip 220 are connected to the lower surfaces of the first pads P1.

In the semiconductor device of the preliminary matters, since the wiring layer 120, which is a single layer, is used, a degree of freedom of wiring routing is low. For this reason, it is difficult to cope with mounting of a high-performance semiconductor chip having various pad layouts.

For example, when connecting a wiring to a pad or connecting predetermined pads each other by a wiring, it is difficult to dispose the wiring in a region between the pads so that an electric short with another pad is not caused.

Also, since the wiring layer, which is a single layer, is used, there is a limit on the wiring density. Therefore, it is not possible to easily cope with a tendency that a pitch of the connection terminals of the electronic component is narrowed.

As the measures against the above problem, it is considered to configure the wiring layer 120 by a multi-layered wiring layer. However, when bending the metal plate 100, the multi-layered wiring layer is also bent at the same time. For this reason, a cured interlayer resin layer of the multi-layered wiring layer may be damaged, so that it is not possible to secure the reliability of the multi-layered wiring layer.

In an electronic component device of an exemplary embodiment to be described below, it is possible to solve the above problems.

(First Exemplary Embodiment)

Figure 17:
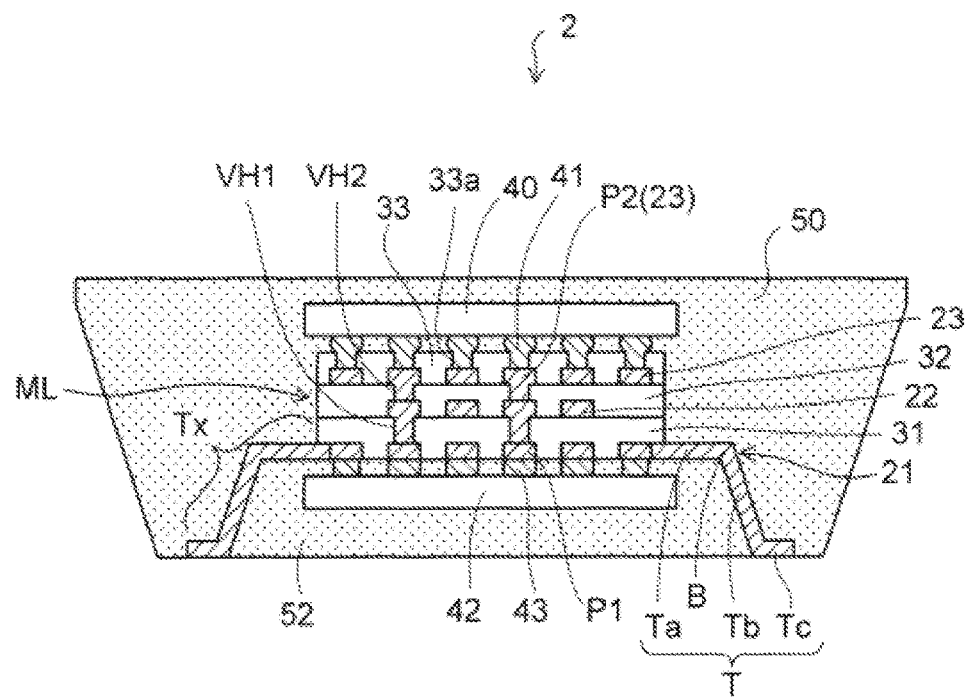
FIG. 17 is a sectional view depicting an electronic component device in accordance with the exemplary embodiment.
Figure 18:
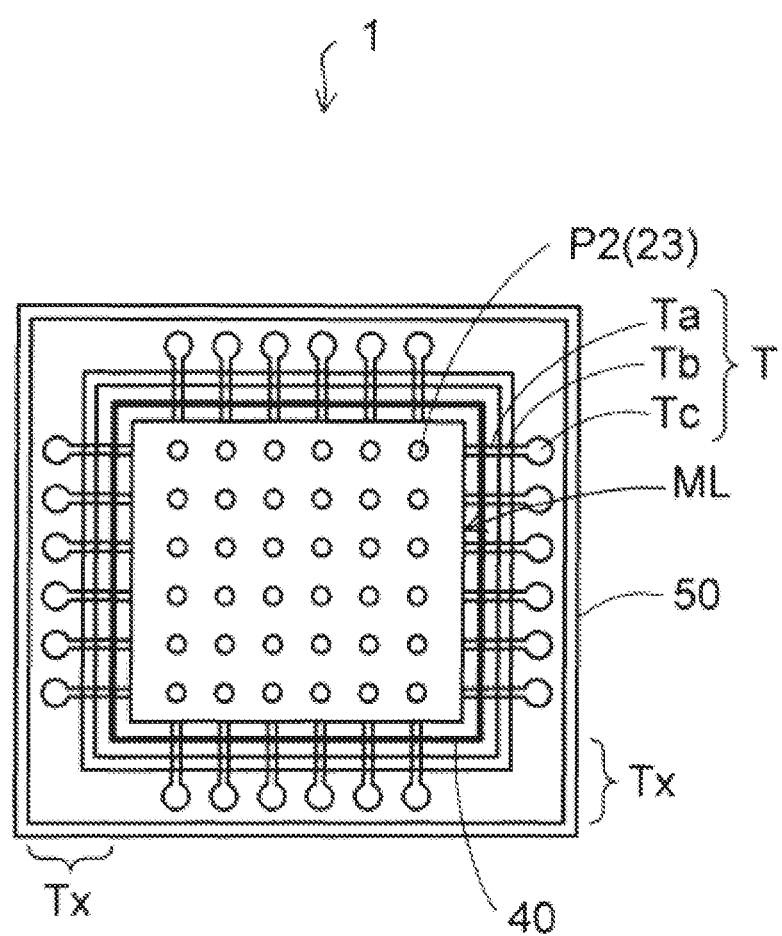
FIG. 18 is a plan view depicting the electronic component device in accordance with the exemplary embodiment.

FIGS. 4A to 9 illustrate a manufacturing method of a wiring substrate of an exemplary embodiment, and FIGS. 10A to 11B illustrate a wiring substrate of the exemplary embodiment. Also, FIGS. 12 to 16 illustrate a manufacturing method of an electronic component device of the exemplary embodiment, and FIGS. 17 and 18 depict an electronic component device of the exemplary embodiment.

In the below, while describing the manufacturing methods of the wiring substrate and the electronic component device, structures of the wiring substrate and the electronic component device are described.

Figure 4A:
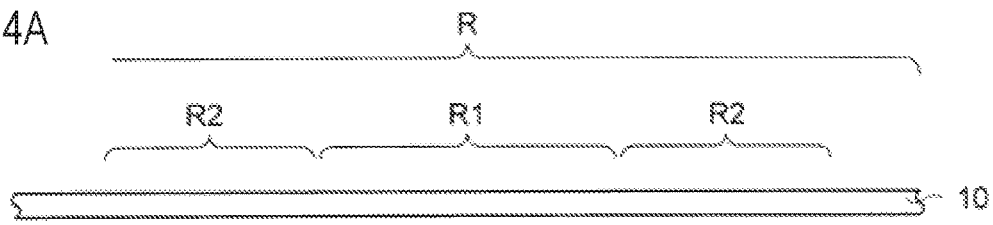
FIGS. 4A to 4D are sectional views and a plan view depicting a manufacturing method of a wiring substrate in accordance with an exemplary embodiment (1 thereof).

In the manufacturing method of the wiring substrate of the exemplary embodiment, as shown in FIG. 4A, a metal plate 10 is first prepared.

The metal plate 10 is favorably formed of aluminum, 42 alloy (42% nickel (Ni)-iron (Fe)) or the like. A thickness of the metal plate 10 is about 0.1 mm to 1 mm.

For the metal plate 10, a plurality of wiring formation regions R is defined. In FIG. 4A, one wiring formation region R of the metal plate 10 is partially shown.

For each wiring formation region R of the metal plate 10, a pad region R1 and a wiring portion region R2 around there are defined.

Figure 4B:
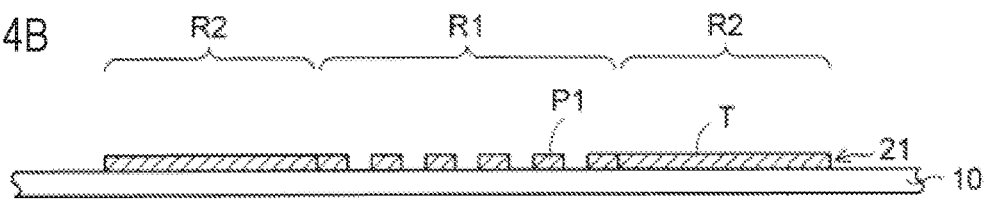
Figure 4C:
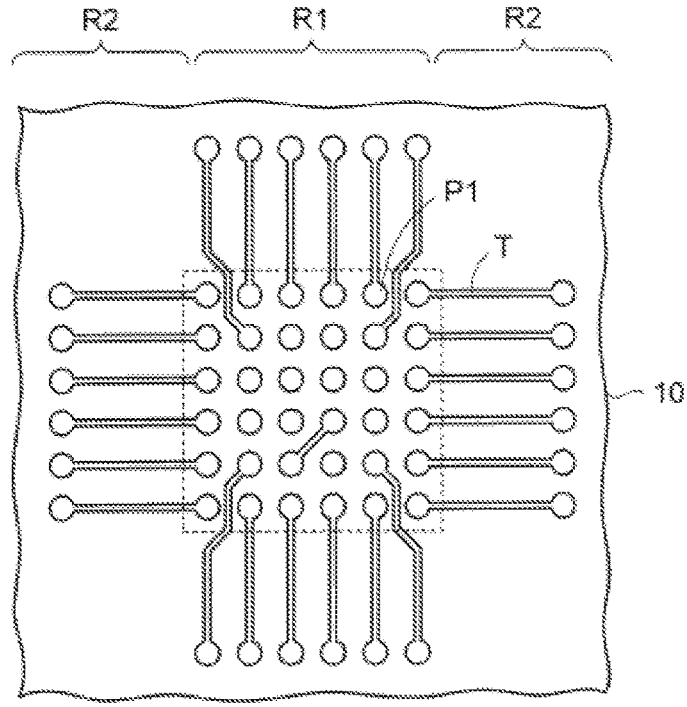

Then, as shown in FIG. 4B, a first wiring layer 21 is formed in each wiring formation region R of the metal plate 10. FIG. 4C is a reduced plan view of the first wiring layer 21 of FIG. 4B, as seen from above. As shown in FIGS. 4B and 4C, a plurality of first pad P1 of the first wiring layer 21 is disposed side by side in the rectangular pad region R1 of a central portion of the wiring formation region R. Also, a plurality of wiring portions T of the wiring layer 21 is disposed side by side in the wiring portion region R2 of the wiring formation region R. The wiring portions T extend outward from an inner side of the wiring portion region R2 around the rectangular pad region R1. The wiring portion T is formed as a wiring for connection terminal.

The wiring portion T is connected to the necessary first pad P1. Also, the first pads P1 may be connected to each other by wirings.

Figure 5A:
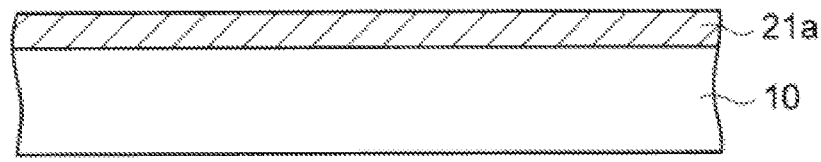
FIGS. 5A to 5D are sectional views depicting a method of forming a wiring layer of FIG. 4B.

Referring to FIGS. 5A to 6B, a method of forming the first wiring layer 21 is described in detail. In this exemplary embodiment, the first wiring layer 21 is formed by a semi-additive method. As shown in FIG. 5A, a seed layer 21a is first formed on the metal plate 10. The seed layer 21a is formed by a sputtering method or an electroless plating method, and a thickness thereof is about 1 µm, for example.

Figure 5B:
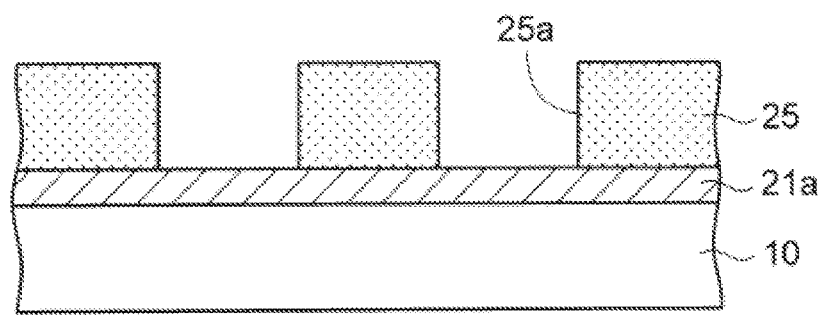

Subsequently, as shown in FIG. 5B, a plated resist layer 25 having openings 25a disposed at portions, at which the first wiring layer 21 is to be disposed, is formed on the basis of photolithography.

Figure 5C:
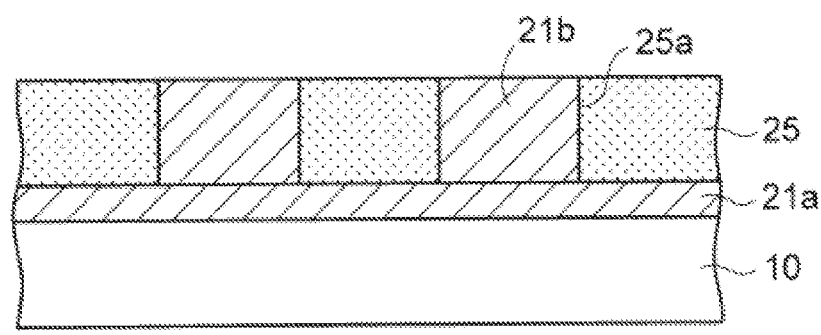

Also, as shown in FIG. 5C, a metal plated layer 21b is formed in the openings 25a of the plated resist layer 25 by an electrolytic plating method in which the seed layer 21a is used as a plating power feeding path. The seed layer 21a and the metal plated layer 21b are formed of copper or the like.

Figure 5D:
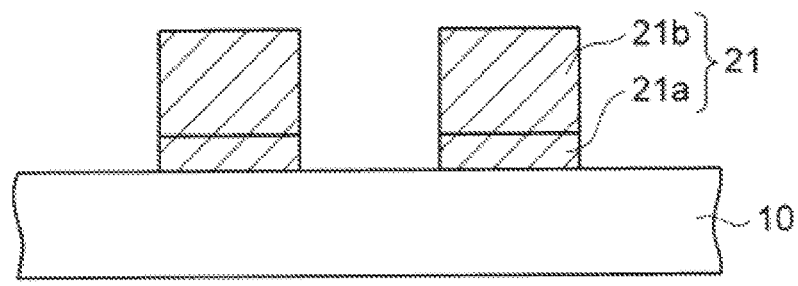

Subsequently, as shown in FIG. 5D, the plated resist layer 25 is removed. Also, the seed layer 21a is removed by wet etching while using the metal plated layer 21b as a mask.

Thereby, the first wiring layer 21 is formed by the seed layer 21a and the metal plated layer 21b disposed thereon. A thickness of the first wiring layer 21 is about 20 µm to 100 µm, for example.

Figure 6A:
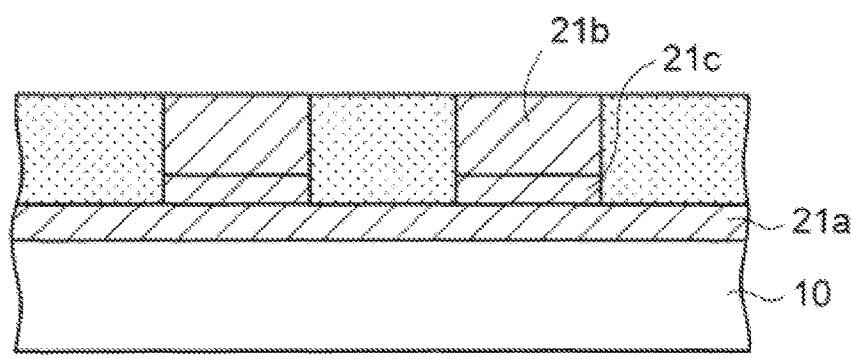
FIGS. 6A and 6B are sectional views depicting a method of forming the wiring layer of FIG. 4B in accordance with a modified embodiment.

In a modified embodiment of the structure of the first wiring layer 21, as shown in FIG. 6A, a nickel (Ni) layer 21c may be formed on the seed layer 21a by the electrolytic plating before forming the metal plated layer 21b in the process of FIG. 5C.

Figure 6B:
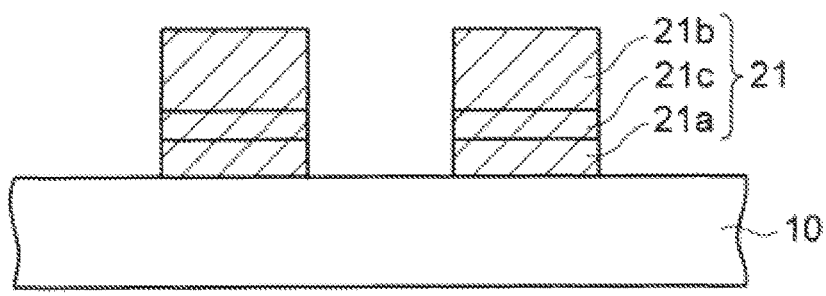

Then, as shown in FIG. 6B, after removing the plated resist layer 25, the seed layer 21a is etched by using the nickel (Ni) layer 21c and the metal plated layer 21b as a mask.

In this aspect, the seed layer 21a, the Ni layer 21c and the metal plated layer 21b are stacked sequentially from below, so that the first wiring layer 21 is formed.

The Ni layer 21c functions not only a barrier layer but also a stopper when removing the metal plate 10 by wet etching, as described later.

In this exemplary embodiment, in order to improve the degree of freedom of wiring routing, a multi-layered wiring layer is formed on the pad region R1 of the wiring formation region R of the metal plate 10 of FIG. 4B.

Figure 4D:
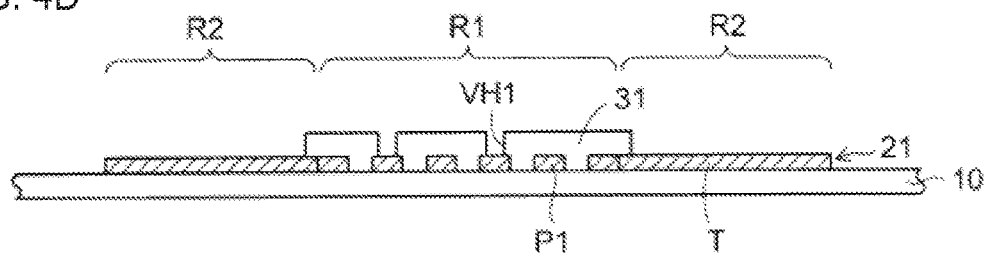

Referring to FIG. 4D, a method of forming the multi-layered wiring layer is described. As shown in FIG. 4D, a first insulation layer 31 is formed in the pad region R1 of the wiring formation region R of the metal plate 10. The first insulation layer 31 is formed to have first via holes VH1 reaching the first pads P1. A thickness of the first insulation layer 31 is about 10 µm to 50 µm, for example.

The first insulation layer 31 is formed by forming a photosensitive resin layer on the metal plate 10 and performing exposure and developing to pattern the resin layer on the basis of photolithography. When forming the photosensitive resin layer, a liquid resin may be applied or an uncured resin film may be adhered.

The first insulation layer 31 is formed in the pad region R1 of the wiring formation region R of the metal plate 10 and is not formed in the region of the wiring portions T, which are to be bent.

In the wiring portion region R2, the photosensitive resin layer is removed by the photolithography, so that the wiring portions T are exposed from the first insulation layer 31.

For example, as the resin layer for forming the first insulation layer 31, a photosensitive permanent resist layer, a polyimide layer or the like is favorably used.

In the example of FIG. 4D, the first insulation layer 31 is formed from the pad region R1 to the inner tip end portion region of the wiring portions T around there. The first insulation layer 31 may also be formed to cover the chip region R1 and parts of the inner sides of the wiring portions T if the first insulation layer 31 is not disposed at parts of the wiring portions T, which are to be bent later.

The parts of the inner sides of the wiring portions T are covered by the first insulation layer 31, so that it is possible to improve the adhesion of the wiring portions T when bending the metal plate 10 and the wiring portions T, which will be described later.

Alternatively, the first insulation layer 31 may be formed only in the pad region R1, and the wiring portions T may be entirely exposed from the first insulation layer 31.

Figure 7A:
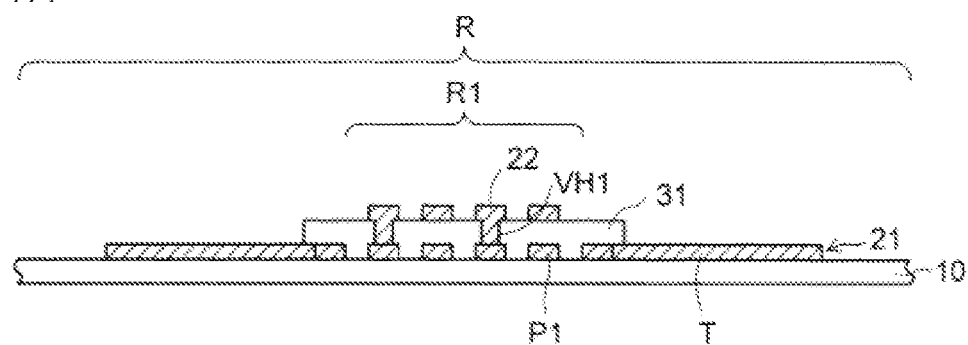
FIGS. 7A to 7C are sectional views depicting the manufacturing method of the wiring substrate in accordance with the exemplary embodiment (2 thereof).

Then, as shown in FIG. 7A, a second wiring layer 22 is formed on the first insulation layer 31. The second wiring layer 22 is connected to the first pads P1 of the first wiring layer 21 through a via conductor in the first via holes VH1.

The second wiring layer 22 is formed by the same semi-additive method as the method of forming the first wiring layer 21. In particular, although not shown, a seed layer is formed on the entire upper surface of the structure shown in FIG. 4D. The seed layer is formed on inner surfaces of the first via holes VH1, the upper surface of the first insulation layer 31 and the wiring portion region R2 of the metal plate 10.

Then, a plated resist layer having openings formed at portions, at which the second wiring layer 22 is to be disposed, is formed on the seed layer. Subsequently, a metal plated layer is formed in the first via holes VH1 and the openings of the plated resist layer by the electrolytic plating in which the seed layer is used as a plating power feeding path.

Also, after removing the plated resist layer, the seed layer is etched and removed by using the metal plated layer as a mask.

Thereby, the second wiring layer 22 is formed from the seed layer and the metal plated layer. The seed layer formed in the wiring portion region R2 of the metal plate 10 is removed at the same time. In this way, the second wiring layer 22 is disposed in the pad region R1 of the metal plate 10.

Figure 7B:
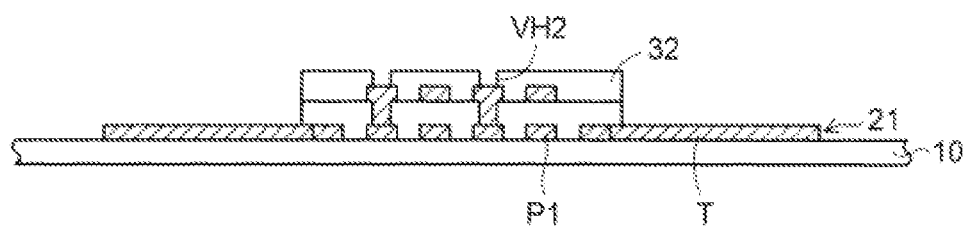

Then, as shown in FIG. 7B, a second insulation layer 32 is formed on the first insulation layer 31 by the same method as the method of forming the first insulation layer 31 of FIG. 4D. The second insulation layer 32 is formed to have second via holes VH2 on connection portions of the second wiring layer 22.

Figure 7C:
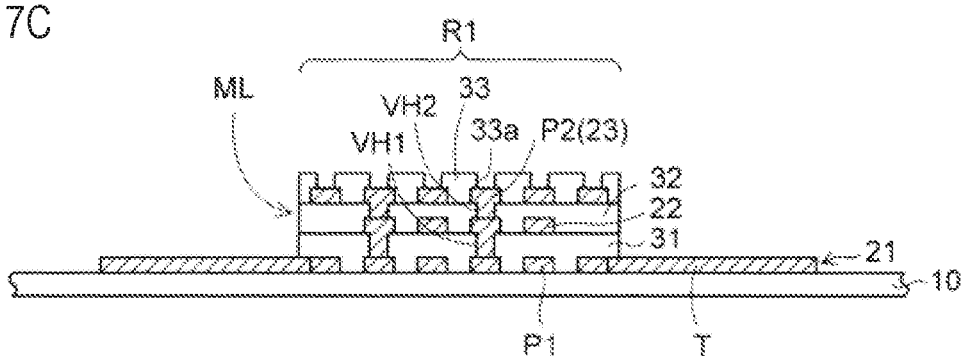

Subsequently, as shown in FIG. 7C, a third wiring layer 23 is formed on the second insulation layer 32 by the same method as the method of forming the second wiring layer 22 of FIG. 7A. The third wiring layer 23 is connected to the second wiring layer 22 through a via conductor in the second via holes VH2.

FIG. 7C depicts second pads P2 as the third wiring layer 23. The second pads P2 may he disposed side by side in an island shape or may he coupled to one ends of lead wirings.

Also, as shown in FIG. 7C, a solder resist layer 33 having openings 33a formed on the second pads P2 is formed on the second insulation layer 32.

By the above processes, a multi-layered wiring layer ML of three layers is formed in the pad region R1 of the metal plate 10. Thereby, the multi-layered wiring layer ML is formed in the pad region R1 of the central portion in each wiring formation region R of the metal plate 10, respectively. A structure where the wiring portions T of the lowest first wiring layer 21 extend outward from an outer periphery of each multi-layered wiring layer ML is obtained.

Figure 8:
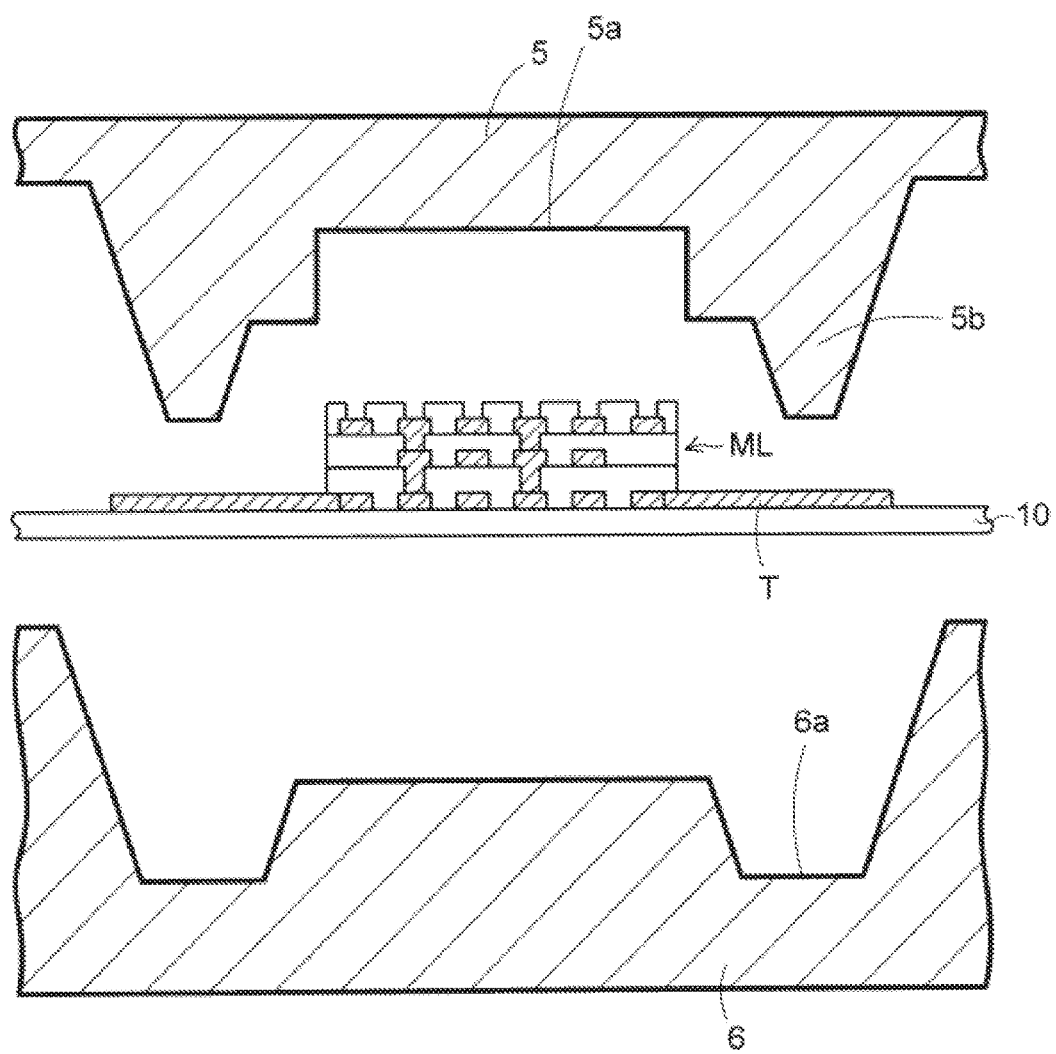
FIG. 8 is a sectional view depicting the manufacturing method of the wiring substrate in accordance with the exemplary embodiment (3 thereof).

Then, as shown in FIG. 8, an upper mold 5 and a lower mold 6 for press-working the structure of FIG. 7C are prepared.

A lower surface of the upper mold 5 is formed with a concave part 5a corresponding to a stereoscopic shape of the multi-layered wiring layer ML of the structure of FIG. 7C. Also, the lower surface of the upper mold 5 is provided with a convex part 5b for bending the metal plate 10 and the wiring portions T in the outer region of the multi-layered wiring layer ML of the structure of FIG. 7C.

Also, an upper surface of the lower mold 6 is provided with a concave part 6a corresponding to the convex part 5b of the upper mold 5. The structure of FIG. 7C is disposed between the lower mold 6 and the upper mold 5.

Figure 9:
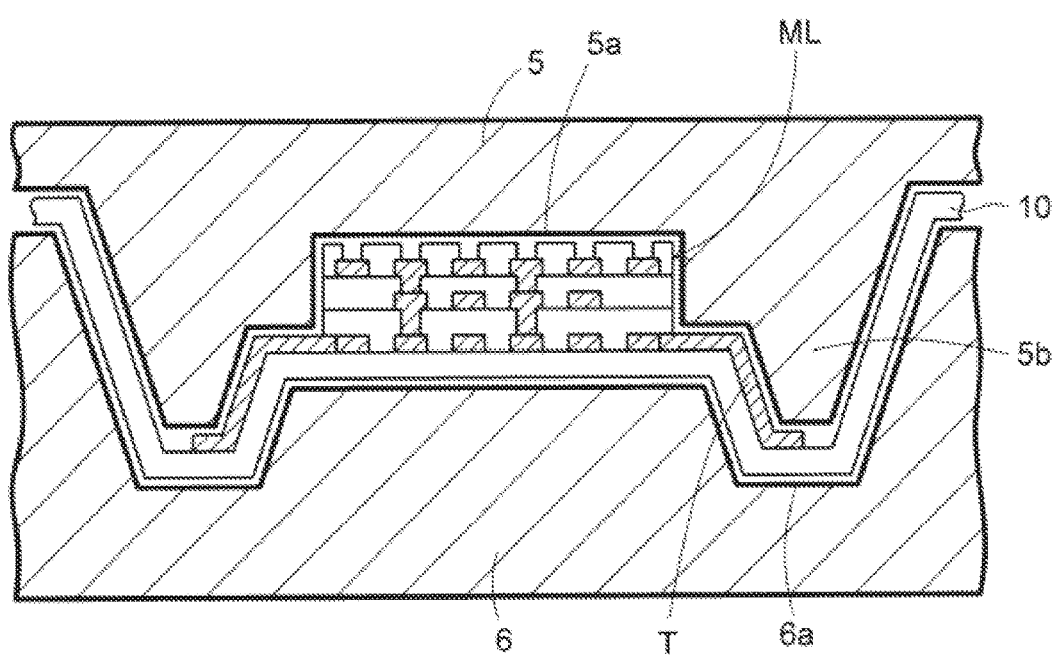
FIG. 9 is a sectional view depicting the manufacturing method of the wiring substrate in accordance with the exemplary embodiment (4 thereof).

Also, as shown in FIG. 9, the upper mold 5 is pressed downward to sandwich and press-work the structure of FIG. 7C with the lower mold 6 and the upper mold 5.

Thereby, at a state where the multi-layered wiring layer ML is accommodated in the concave part 5a of the upper mold 5, the metal plate 10 and the wiring portions T in the outer region of the multi-layered wiring layer ML are bent by the convex part 5b of the upper mold 5 and the concave part 6a of the lower mold 6.

At this time, since the multi-layered wiring layer ML is not bent, there are no concerns that the first and second cured insulation layers 31, 32 and the solder resist layer 33 of the multi-layered wiring layer ML are to be damaged.

Figure 10A:
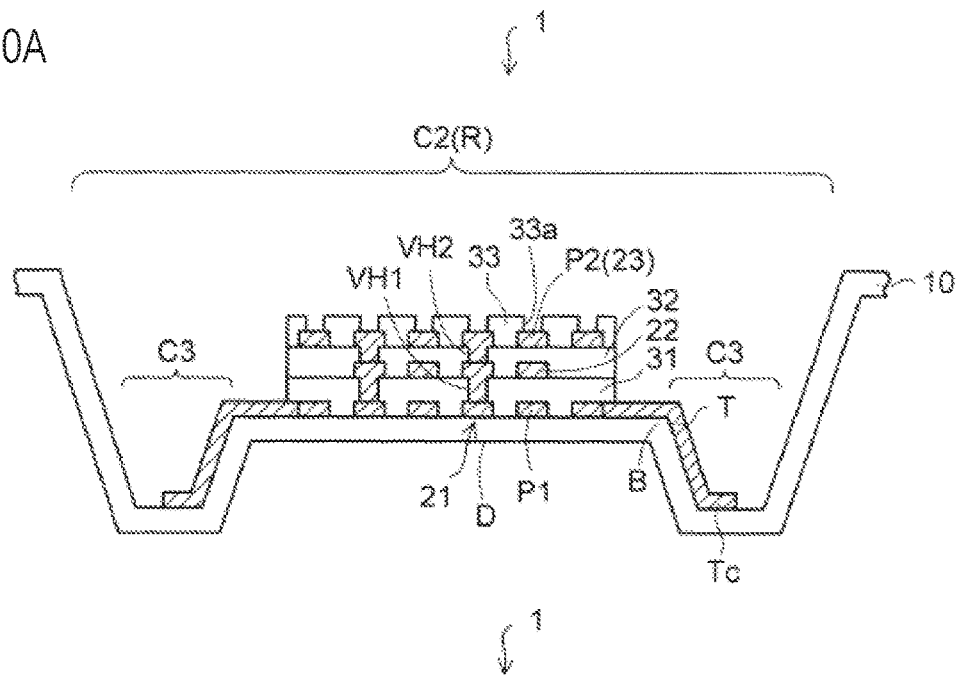
FIGS. 10A and 10B are a sectional view and a plan view depicting a wiring substrate of the exemplary embodiment.
Figure 10B:
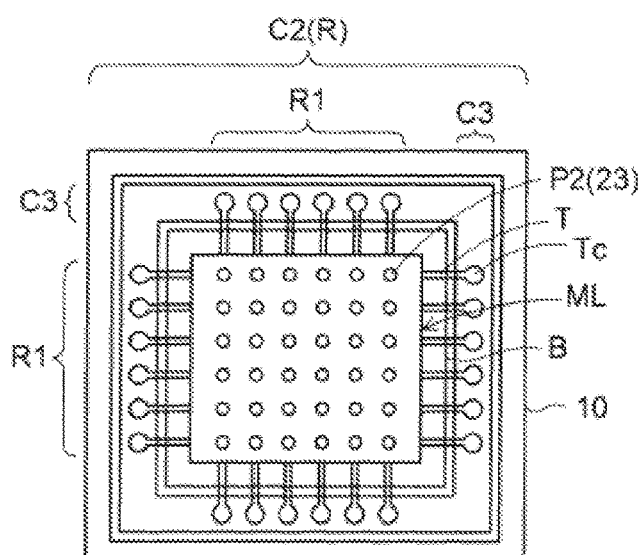

FIG. 10A depicts a state where the upper mold 5 and the lower mold 6 are detached from the press-worked metal plate 10 of FIG. 9. FIG. 10B is a reduced plan view of FIG. 10A, as seen from above.

Figure 11A:
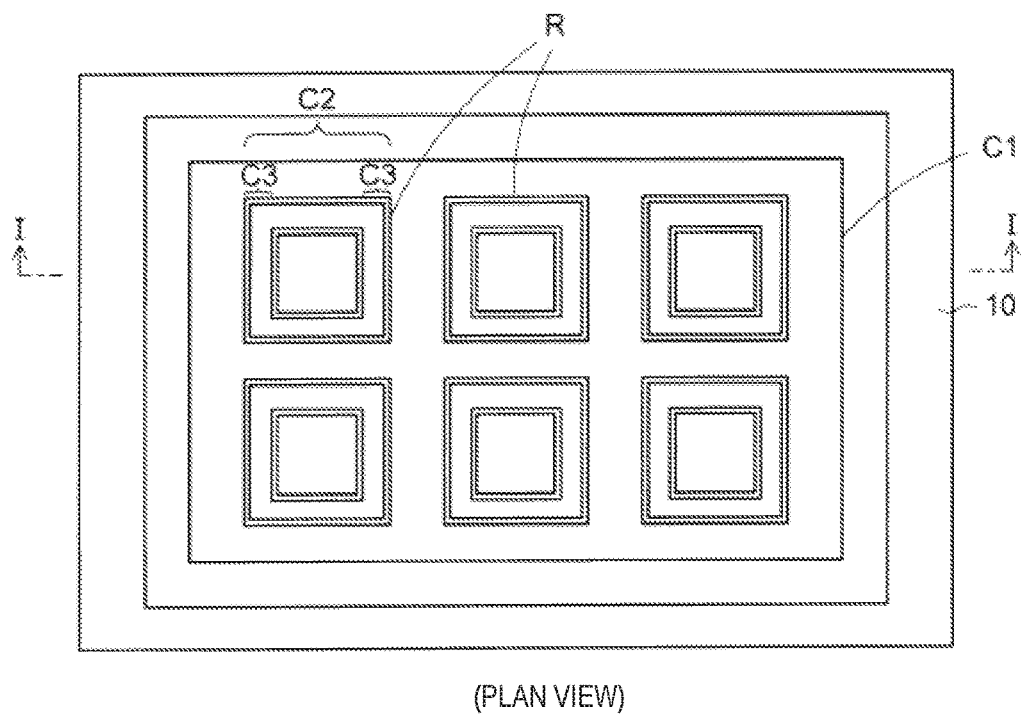
FIGS. 11A and 11B are a sectional view and a plan view depicting an entire appearance of a metal plate of the press-worked wiring substrate of FIGS. 10A and 10B.
Figure 11B:
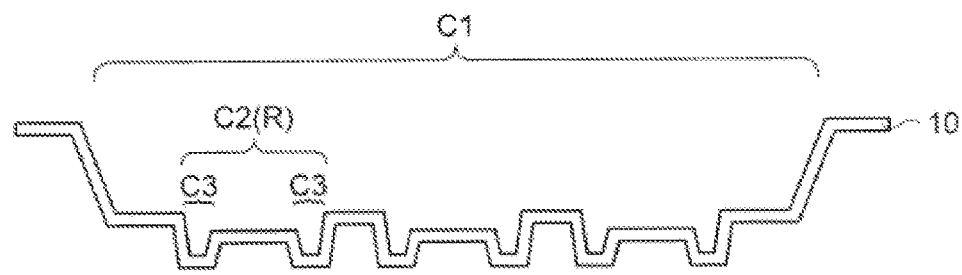

Also, FIGS. 11A and 11B depict an entire shape of the press-worked metal plate 10 of FIGS. 10A and 10B. FIG. 11B is a sectional view taken along a line I-I of FIG. 11A. In FIGS. 11A and 11B, the multi-layered wiring layer ML formed in each wiring formation region R of FIGS. 10A and 10B is not shown for simple illustration.

As shown in FIGS. 11A and 11B, a first cavity C1 is formed at the central portion of the metal plate 10 by the press working. The metal plate 10 has a rectangular shape, as seen from a plan view, and the first cavity C1 is disposed at the central portion except for the peripheral edge portion of the metal plate 10.

As described later, the first cavity C1 functions as a wall part configured to block a mold resin when sealing a semiconductor chip by the mold resin.

Also, as shown in the plan view of FIG. 11A, a plurality of wiring formation regions R is defined for a bottom portion of the first cavity C1 of the metal plate 10.

Also, at the same time, a second cavity C2 is formed in each wiring formation region R of the metal plate 10. The second cavity C2 is formed in the metal plate 10 of each wiring formation region R in which the multi-layered wiring layer ML (FIG. 10A) is disposed, respectively.

Also, at the same time, frame-shaped concave parts C3 are formed at peripheral edge portions of a bottom portion of the second cavity C2 in each wiring formation region R.

In FIGS. 10A and 10B, one wiring formation region R of the metal plate 10 of FIGS. 11A and 11B is partially shown.

Referring to FIG. 10A, the central portion of the bottom surface of the second cavity C2 and the bottom surfaces of the concave parts C3 are formed as horizontal surfaces. The concave parts C3 are further depressed downward than the central portion of the bottom surface of the second cavity C2.

The wiring portions T of the first wiring layer 21 are bent simultaneously with the metal plate 10, and are bent and disposed from parts on the bottom portion of the second cavity C2 of the metal plate 10 along the side surfaces and bottom surfaces of the concave parts C3. Also, a depressed part D is formed at the lower surface-side of the wiring formation region R of the metal plate 10.

By the above processes, as shown in FIG. 10A, a wiring substrate 1 of the exemplary embodiment is obtained.

As shown in FIG. 10A, the wiring substrate 1 of the exemplary embodiment has the metal plate 10 for which the plurality of wiring formation regions R is defined. In each wiring formation region R of the metal plate 10, the second cavity C2 is formed. The frame-shaped concave parts C3 are formed at the peripheral edge portions of the bottom portion of the second cavity C2. The peripheral edge portions of the bottom portion of the second cavity C2 are bent obliquely downward and outward at bent portions B and are thus configured as sidewalls of the concave parts C3.

The multi-layered wiring layer ML is disposed at the central portion of the bottom portion of the second cavity C2 of the metal plate 10. The lowest first wiring layer 21 of the multi-layered wiring layer ML has the first pads P1 disposed at the central portion of the bottom portion of the second cavity C2 and the wiring portions T connected to the first pads P1 and extending outward.

The plurality of first pads P1 of the first wiring layer 21 is disposed side by side at the central portion of the bottom portion of the second cavity C2. Also, the wiring portions T extend outward from the periphery of the first pads P1, are bent obliquely downward and outward at the bent portions B of the bottom portion of the second cavity C2, and are bent horizontally on the bottom surfaces of the concave parts C3.

In this way, the wiring portion T is connected to the first pad P1, is disposed on the bottom portion of the second cavity C2 so as to extend to the bottom surface of the concave part C3 along the side surface of the concave part C3, and is bent along the concave part C3.

A tip end portion of the wiring portion T disposed on the bottom surface of the concave part C3 is configured as a connection portion Tc. In this way, the wiring portion T has the connection portion Tc horizontally disposed at the outer tip end portion.

Also, the frame-shaped concave parts C3 are formed at the upper surface-side of the metal plate 10, so that the depressed part D having a concave shape is formed at the lower surface-side of the central portion of each wiring formation region R of the metal plate 10.

Referring to a plan view of FIG. 10B, the multi-layered wiring layer ML disposed in a rectangular shape, as seen from above, is disposed in the pad region R1 of the bottom surface of the second cavity C2 of the metal plate 10, and is not disposed on the frame-shaped concave part C3 of the metal plate 10.

In this way, the multi-layered wiring layer ML is disposed in the chip region R1 inside the bent portions B provided at the peripheral edge portions of the bottom portion of the metal plate 10, and the plurality of bent wiling portions T extends outward with being exposed from the outer peripheries of the four sides of the multi-layered wiring layer ML.

The multi-layered wiring layer ML is disposed at the central portion of the second cavity C2 so as to cover the first pads and parts of the wiring portions T.

Referring to FIG. 10A, in the multi-layered wiring layer ML, the first insulation layer 31 is formed on the metal plate 10 and the first pads P1 of the first wiring layer 21. The first insulation layer 31 has the first via holes VH1 reaching the first pads P1 of the first wiring layer 21.

Also, the second wiring layer 22 connected to the first pads P1 through the via conductor in the first via holes VH1 is formed on the first insulation layer 31.

Also, the second insulation layer 32 is formed on the first insulation layer 31.

The second insulation layer 32 has the second via holes VH2 reaching the connection portions of the second wiring layer 22.

Also, the second pads P2 connected to the second wiling layer 22 via the via conductor in the second via holes VH2 are formed on the second insulation layer 32. The second pads P2 are formed as the third wiring layer 23.

Also, the solder resist layer 33 having the opening 33a formed on the second pads P2 is formed on the second insulation layer 32.

In this way, the second pads P2 of the multi-layered wiring layer ML is electrically connected to the lowest first wiring layer 21.

In the wiring substrate 1 of the exemplary embodiment, the multi-layered wiring layer ML is disposed in the pad region R1 inside the region in which the metal plate 10 and the wiring portions T of the first wiring layer 21 are to be bent.

For this reason, when bending the metal plate 10 and the wiring portions T of the first wiring layer 21, the multi-layered wiring layer ML is not bent, so that the first and second cured insulation layer 31, 32 and the solder resist layer 33 of the multi-layered wiring layer ML are not damaged.

Also, since it is possible to adopt the multi-layered wiring layer ML, it is possible to improve the degree of freedom of wiring routing, so that it is possible to cope with the mounting of the semiconductor chip having various pad layouts.

Figure 12:
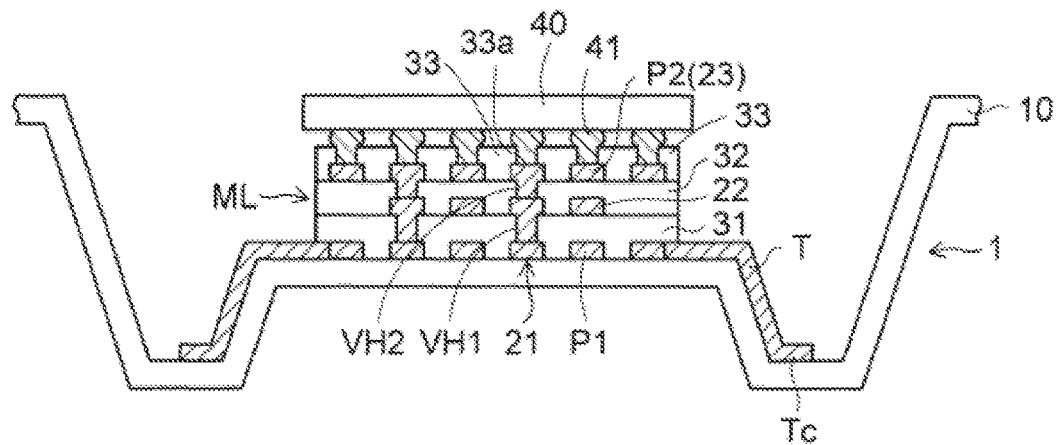
FIG. 12 is a sectional view depicting a manufacturing method of an electronic component device in accordance with the exemplary embodiment (1 thereof).

Subsequently, a method of manufacturing an electronic component device by using the wiring substrate 1 of FIGS. 10A and 10B is described. As shown in FIG. 12, a first semiconductor chip 40 having connection terminals 41 is first prepared. Then, the connection terminals 41 of the first semiconductor chip 40 are flip chip-connected to the upper surfaces of the second pads P2 (the third wiring layer 23) provided at the upper surface-side of the multi-layered wiring layer ML of the wiring substrate 1.

The first semiconductor chip 40 is an example of the first electronic component, and a variety of electronic components having connection terminals can be used.

Figure 13:
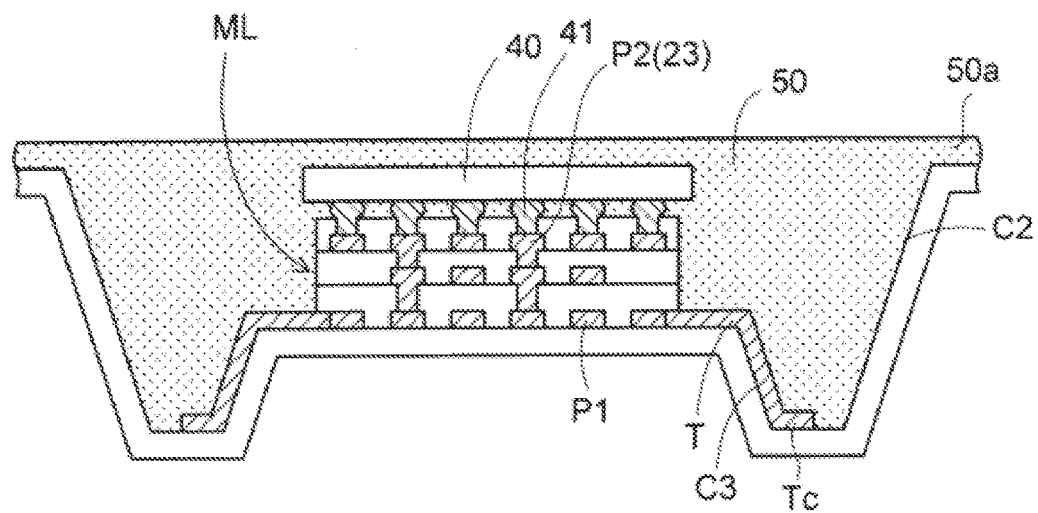
FIG. 13 is a sectional view depicting the manufacturing method of the electronic component device in accordance with the exemplary embodiment (2 thereof).

Subsequently, as shown in FIG. 13, a first mold resin 50 for sealing the multi-layered wiring layer ML, the first semiconductor chip 40 and the upper surfaces of the wiring portions T are formed on the metal plate 10. The first mold resin 50 is also filled between the semiconductor chip 40 and the multi-layered wiring layer ML.

The first mold resin 50 is formed by a transfer mold method or a potting method of injecting and resin-molding a liquid resin into a mold. As the first mold resin 50, an epoxy resin is used, for example.

The first mold resin 50 is formed to fill the second cavity C2 and the concave parts C3, and an upper surface thereof is formed to be flat. The first mold resin 50 is formed with being coupled to mold resins formed in other adjacent wiring formation regions R by coupling portions 50a.

At this time, as described with respect to FIGS. 11A and 11B, the side surfaces of the first cavity C1 formed in the metal plate 10 function as wall parts configured to block the first mold resin 50.

Figure 14:
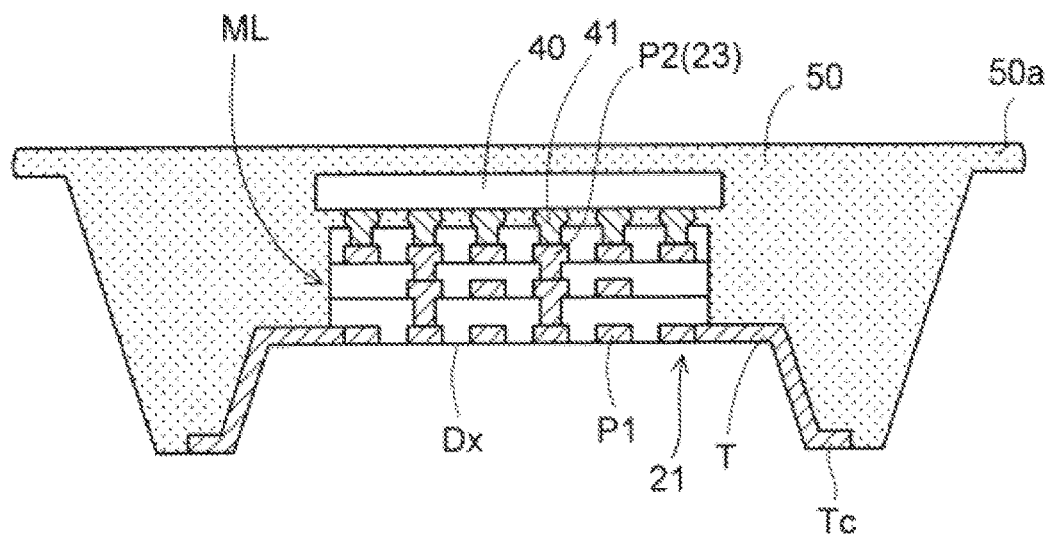
FIG. 14 is a sectional view depicting the manufacturing method of the electronic component device in accordance with the exemplary embodiment (3 thereof).

Then, as shown in FIG. 14, the metal plate 10 is removed from the structure of FIG. 13 by wet etching. When the metal plate 10 is formed of aluminum, a hydrochloric acid (HCl) solution is used as the etching solution. Alternatively, when the metal plate 10 is formed of 42 alloy, a hydrofluoric (HF)-based solution is used as the etching solution.

Thereby, the metal plate 10 can be selectively removed with respect to the first wiring layer 21 (copper) and the first mold resin 50.

By the above processes, respective lower surfaces of the first pads P1 and the wiring portions T of the first wiring layer 21 and a lower surface of the first mold resin 50 are exposed. An accommodation part Dx corresponding to the depressed part D of the metal plate 10 is provided at the lower surface-side of the first wiring layer 21.

As shown in FIG. 6B, the Ni layer 21c may be formed on the seed layer 21a of the first wiring layer 21. In this case, even though the seed layer 21a of the thin film is etched when removing the metal plate 10, the Ni layer 21c functions as a stopper, so that the metal plated layer 21b is prevented from being etched.

Also, in a manufacturing method of a modified embodiment, in the process of forming the first wiring layer 21 of FIG. 5D, after removing the plated resist layer 25, the seed layer 21a may be left on the entire surface of the metal plate 10.

In this case, after removing the metal plate 10 in the process of FIG. 14, the exposed seed layer 21a is removed by wet etching using a mixed solution ($H_2SO_4+H_2O_2$) of sulfuric acid and hydrogen peroxide. In this method, when etching the seed layer 21a, it is preferably to use the Ni layer 21c (FIG. 6B) as a stopper since the metal plated layer 21b is a little etched.

Figure 15:
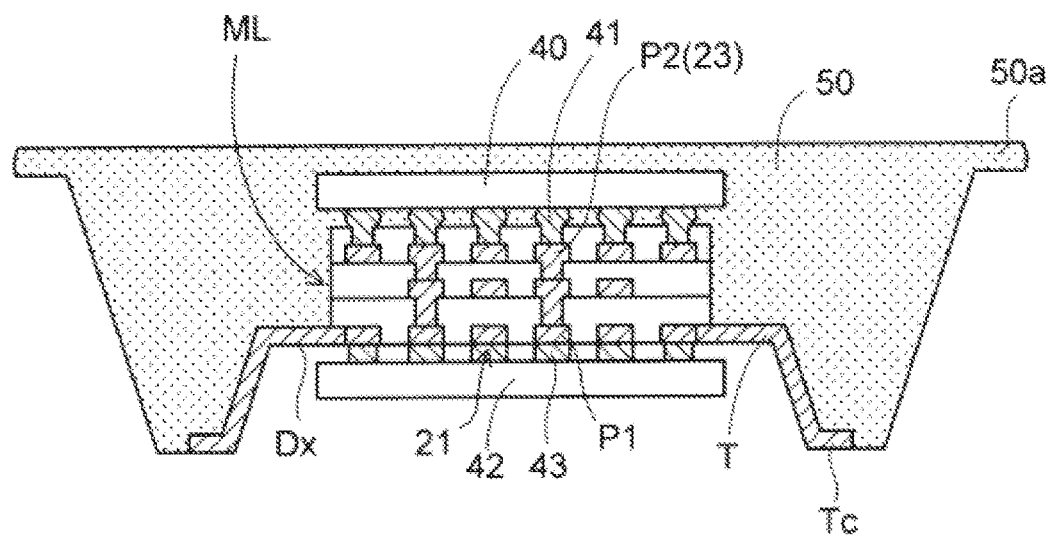
FIG. 15 is a sectional view depicting the manufacturing method of the electronic component device in accordance with the exemplary embodiment (4 thereof).

Then, as shown in FIG. 15, a second semiconductor chip 42 having connection terminals 43 is prepared. Then, the connection terminals 43 of the second semiconductor chip 42 are flip chip-connected to the lower surfaces of the first pads P1 of the first wiring layer 21 provided at the lower surface-side of the multi-layered wiring layer ML.

Thereby, the second semiconductor chip 42 is accommodated in the accommodation part Dx having a concave shape and provided at the lower surface-side of the first wiring layer 21 and the first mold resin 50.

The second semiconductor chip 42 is an example of the second electronic component, and various electronic components having connection terminals can be used.

For example, when the first semiconductor chip 40 is used in FIG. 12, a chip capacitor, a quartz vibrator or the like may be mounted instead of the second semiconductor chip 42. As the semiconductor chip, an LSI chip such as a CPU chip, a memory chip and the like is used.

Figure 16:
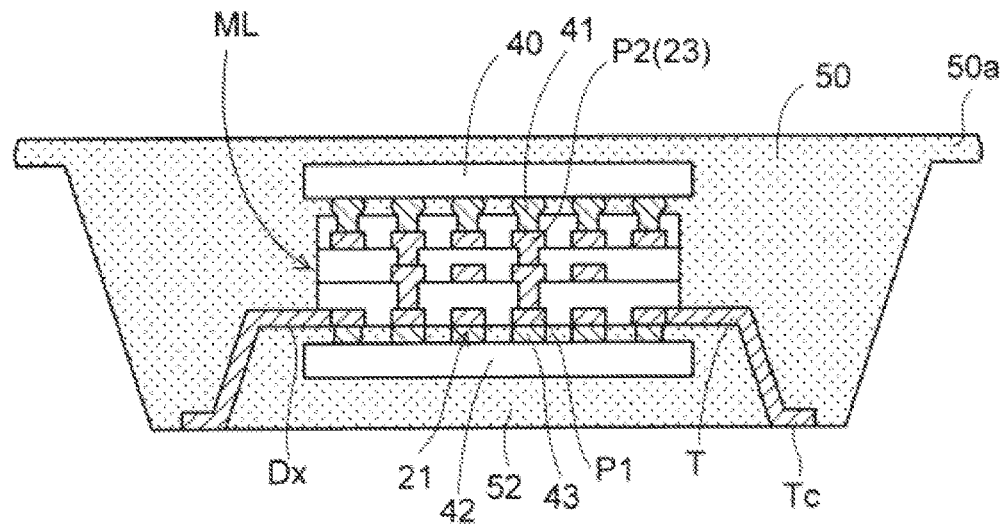
FIG. 16 is a sectional view depicting the manufacturing method of the electronic component device in accordance with the exemplary embodiment (5 thereof).

Subsequently, as shown in FIG. 16, a second mold resin 52 for sealing the second semiconductor chip 42 and the lower surfaces of the wiring portions T is formed at the lower surface-side of the first wiring layer 21 and the first mold resin 50. The second mold resin 52 is formed to fill the accommodation part Dx having a concave shape, and a lower surface thereof is formed to be flat. Also, the second mold resin 52 is formed so that the lower surfaces of the horizontally disposed connection portions Tc of the wiring portions T are to be exposed from the lower surface of the second mold resin 52.

Then, as shown in FIG. 17, the coupling portions 50a of the first mold resin 50 are cut to obtain each electronic component device 2.

As shown in FIG. 17, the electronic component device 2 of the exemplary embodiment has the multi-layered wiring layer ML in which the metal plate 10 has been removed from the wiring substrate 1 shown in FIGS. 10A and 10B.

The lowest first wiring layer 21 of the multi-layered wiring layer ML has the first pads P1 and the wiring portions T connected to the first pads P1 and extending outward from the outer periphery of the multi-layered wiring layer ML.

The wiring portion T has a horizontal wiring portion Ta, an inclined wiring portion Tb bent downward from the horizontal wiring portion Ta at the bent portion B, and a connection portion Tc bent horizontally outward from a lower end of the inclined wiring portion Tb. In this way, the wiring portion T is bent downward on the way in the extending direction thereof.

The first insulation layer 31 of the multi-layered wiring layer ML is disposed so that the wiring portions T are exposed from the first insulation layer 31. In the example of FIG. 17, an outer portion of the horizontal wiring portion Ta of the wiring portion T, the bent portion B, the inclined wiring portion Tb and the connection portion Tc are exposed from the first insulation layer 31. The first insulation layer 31 is disposed from the region in which the first pads P1 are disposed to the region inside the horizontal wiring portions Ta of the wiring terminal portions T.

The second wiring layer 22 is formed on the first insulation layer 31. The second wiring layer 22 is connected to the first pads P1 through the via conductor in the first via holes VH1 of the first insulation layer 31.

Also, the second insulation layer 32 is formed on the first insulation layer 31. The second insulation layer 32 is disposed in the same region as the first insulation layer 31, and the wiring portions T are likewise exposed from the second insulation layer 32.

Also, the second pads P2 are formed on the second insulation layer 32. The second pads P2 are formed as the third wiring layer 23. The second pads P2 are connected to the second wiring layer 22 through the via conductor in the second via holes VH2 of the second insulation layer 32.

Also, the solder resist layer 33 having the openings 33a formed on the second pads P2 is formed on the second insulation layer 32. The solder resist layer 33 is disposed in the same region as the first and second insulation layers 31, 32, and the wiring portions T are likewise exposed from the solder resist layer 33.

In this way, the multi-layered wiring layer ML including the first to third wiring layers 21 to 23 is established.

In addition to the example of FIG. 17, the multi-layered wiring layer ML may be disposed so that the entire wiring portions T are exposed from the first insulation layer 31.

The staking number of the multi-layered wiring layer ML may be arbitrarily set. Also, the solder resist layer 33 may he omitted.

Also, in order to improve the adhesion with the mold resin 50, the surface of the first wiring layer 21 may be roughened.

FIG. 18 is a reduced plan view of the electronic component device 2 of FIG. 17, as seen from above. In FIG. 18, the first semiconductor chip 40 and the first mold resin 50 are perspectively shown.

Referring to FIGS. 17 and 18, the plurality of wiring portions T extends outward from the outer peripheries of the four sides of the multi-layered wiring layer ML disposed in a rectangular shape, as seen from above, and the plurality of wiring portions T is exposed from the multi-layered wiring layer ML.

In this way, the first wiring layer 21 has exposed wiring portions Tx exposed to the outside of the multi-layered wiring layer ML, as seen from above, and the exposed wiring portions Tx are bend downward on the way in the extending direction thereof.

Also, the connection portion Tc of the wiring portion T is formed into a circular shape having a diameter greater than a width of the inclined wiring portion Tb.

Also, the connection terminals 41 of the rectangular first semiconductor chip 40 are flip chip-connected to the second pads P2 provided at the upper surface-side of the rectangular multi-layered wiring layer ML.

Also, the connection terminals 43 of the rectangular second semiconductor chip 42 are flip chip-connected to the lower surfaces of the first pads P1 provided at the lower surface-side of the multi-layered wiring layer ML.

Also, the multi-layered wiring layer ML, and the upper surfaces of the wiring portions T of the first wiring layer 21 and the first semiconductor chip 40 are sealed by the first mold resin 50. The first semiconductor chip 40 and the multi-layered wiring layer NIL are also filled therebetween with the first mold resin 50.

Also, the second semiconductor chip 42 and the lower surfaces of the wiring portions T of the first wiring layer 21 are sealed by the second mold resin 52. The second semiconductor chip 42 and the multi-layered wiring layer ML are also filled therebetween with the second mold resin 52.

The lower surfaces of the connection portions Tc of the wiring portions T of the first wiring layer 21 are exposed from the second mold resin 52.

In the electronic component device 2 of the exemplary embodiment, as described above, the multi-layered wiring layer ML is adopted so as to improve the degree of freedom of wiring routing. Also, in order to secure the accommodation part Dx of the second semiconductor chip 42 and to dispose the connection portions Tc of the wiring portion T at the lower surface-side, the metal plate 10 and the wiring portions T are bent downward.

In the exemplary embodiment, the multi-layered wiring layer ML, is disposed inside the bent portions B of the wiring portions T of the first wiring layer 21 so that the multi-layered wiring layer ML is not to be bent.

For this reason, even when the multi-layered wiring layer ML is adopted, the first and second cured insulation layers 31, 32 and the solder resist layer 33 of the multi-layered wiring layer ML are not damaged.

In this way, the electronic component device 2 having a structure where the multi-layered wiring layer ML is provided and the connection portions Tc of the wiring portions T are exposed at the lower surface-side is reliably manufactured.

In the electronic component device 2 of the exemplary embodiment, the multi-layered wiring layer can be adopted. Therefore, the degree of freedom of wiring routing is remarkably improved, so that it is possible to cope with the mounting of the high-performance semiconductor chip having various pad layouts.

Also, since it is possible to improve the wiring density by the multilayer, it is possible to cope with a tendency that a pitch of the connection terminals of the electronic component is narrowed.

1. A manufacturing method of a wiring substrate, the method comprising:
   preparing a metal plate in which at least one wiring formation region is defined;
   forming a first pad at a central portion of the wiring formation region of the metal plate and forming a wiring portion to be connected to the first pad at a peripheral edge portion of the wiring formation region;
   forming a multi-layered wiring layer at the central portion of the wiring formation region of the metal plate, the multi-layered wiring layer being configured to cover the first pad and a part of the wiring portion and to have a second pad provided at an upper surface-side and connected to the wiring portion; and
   bending downward the peripheral edge portion of the wiring formation region of the metal plate and the wiring portion by press working.

2. The manufacturing method according to claim 1, wherein in the bending by press working,
   a cavity is formed in the wiring formation region of the metal plate and a frame-shaped concave part is formed at a peripheral edge portion of the cavity, and
   the wiring portion is bent from a part on a bottom portion of the cavity along a side surface and a bottom surface of the concave part.

3. The manufacturing method according to claim 1, wherein in the preparing the metal plate, the metal plate is formed of aluminum or 42 alloy, and
   wherein in the forming the first pad and the wiring portion, the first pad and the wiring portion are formed of copper.

4. A manufacturing method of an electronic component device, the method comprising:

preparing a metal plate in which at least one wiring formation region is defined;

forming a first pad at a central portion of the wiring formation region of the metal plate and forming a wiring portion to be connected to the first pad at a peripheral edge portion of the wiring formation region;

forming a multi-layered wiring layer at the central portion of the wiring formation region of the metal plate, the multi-layered wiring layer being configured to cover the first pad and a part of the wiring portion and to have a second pad provided at an upper surface-side and connected to the wiring portion;

bending downward the peripheral edge portion of the wiring formation region of the metal plate and the wiring portion by press working and providing a connection portion horizontally disposed at an outer tip end portion of the wiring portion;

connecting a connection terminal of a first electronic component to the second pad of the multi-layered wiring layer;

forming, on the metal plate, a first resin for sealing the multi-layered wiring layer, the first electronic component and an upper surface of the wiring portion;

removing the metal plate;

connecting a connection terminal of a second electronic component to a lower surface of the first pad of the multi-layered wiring layer; and forming a second resin for sealing the second electronic component and a lower surface of the wiring portion and exposing a lower surface of a connection portion of the wiring portion from a lower surface of the second resin.

5. The manufacturing method according to claim 4, wherein in the bending by press working, a cavity is formed in the wiring formation region of the metal plate and a frame-shaped concave part is formed at a peripheral edge portion of the cavity, and the wiring portion is bent from a part on a bottom portion of the cavity along a side surface and a bottom surface of the concave part.

6. The manufacturing method according to claim 4, wherein in the preparing the metal plate, the metal plate is formed of aluminum or 42 alloy, and wherein in the forming the first pad and the wiring portion, the first pad and the wiring portion are formed of copper.

What is claimed is:

1. A wiring substrate comprising:

a metal plate in which at least one wiring formation region is defined;

a cavity formed in the wiring formation region of the metal plate;

a concave part formed to have a frame shape at a peripheral edge portion of a bottom portion of the cavity;

a first pad disposed at a central portion of the bottom portion of the cavity, the central portion being a portion of the bottom portion of the cavity where the concave part is not formed;

a wiring portion connected to the first pad, and disposed on and extended along the central portion of the bottom portion of the cavity, a side surface of the concave part and a bottom surface of the concave part; and a multi-layered wiring layer disposed at the central portion of the bottom portion of the cavity so as to cover the first pad and a part of the wiring portion, the multi-layered wiring layer having a second pad provided at an upper surface-side of the multi-layered wiring layer and connected to the wiring portion, wherein the first pad and a part of the wiring portion are embedded in the multi-layered wiring layer.

2. The wiring substrate according to claim 1, further comprising:

a depressed part provided at a lower surface-side of a central portion of the wiring formation region of the metal plate by the concave part.

3. The wiring substrate according to claim 1, wherein the metal plate is formed of aluminum or 42 alloy, and wherein the first pad and the wiring portion are formed of copper.

4. The wiring substrate according to claim 1, wherein the multi-layered wiring layer covers an upper surface and a side surface of the first pad, and the multi-layered wiring layer covers an upper surface and a side surface of the part of the wiring portion.

5. The wiring substrate according to claim 4, wherein an insulating layer which is a lowermost layer of the multi-layered wiring layer covers the upper surface and the side surface of the first pad, and covers the upper surface and the side surface of the part of the wiring portion.

6. The wiring substrate according to claim 4, wherein a lower surface of the first pad is flush with a lower surface of the multi-layered wiring layer.

7. An electronic component device comprising:

a wiring layer comprising a first pad and a wiring portion connected to the first pad;

a multi-layered wiring layer formed on the wiring layer and having a second pad provided at an upper surface-side of the multi-layered wiring layer and connected to the wiring layer;

a first electronic component having a connection terminal connected to an upper surface of the second pad of the multi-layered wiring layer;

a second electronic component having a connection terminal connected to a lower surface of the first pad of the wiring layer;

a first resin configured to seal the multi-layered wiring layer, the first electronic component and an upper surface of the wiring portion; and a second resin configured to seal the second electronic component and a lower surface of the wiring portion, wherein the wiring portion has an exposed wiring portion extending with being exposed to an outside of the multi-layered wiring layer, as seen from a plan view, wherein the exposed wiring portion is bent downward on the way in an extending direction thereof, wherein the wiring portion has a connection portion horizontally disposed at an outer tip end portion, and a lower surface of the connection portion is exposed from a lower surface of the second resin, and wherein the first pad and a part of the wiring portion are embedded in the multi-layered wiring layer.

8. The electronic component device according to claim 7, wherein the multi-layered wiring layer is configured to cover an inner tip end portion of the wiring portion.

9. The electronic component device to claim 7, wherein the multi-layered wiring layer covers an upper surface and a side surface of the first pad, and the multi-layered wiring layer covers an upper surface and a side surface of the part of the wiring portion.

10. The electronic component device according to claim 7, wherein the connection terminal of the first electronic component is flip-chip connected to the upper surface of the second pad of the multi-layered wiring layer, and the connection terminal of the second electronic component is flip-chip connected to the lower surface of the first pad of the wiring layer.

11. The electronic component device according to claim 9, wherein an insulating layer which is a lowermost layer of the multi-layered wiring layer covers the upper surface and the side surface of the first pad, and covers the upper surface and the side surface of the part of the wiring portion.

12. The electronic component device according to claim 9, wherein a lower surface of the first pad is flush with a lower surface of the multi-layered wiring layer.

* * * * *